(12) United States Patent
Madan et al.

(10) Patent No.: US 7,443,708 B2
(45) Date of Patent: Oct. 28, 2008

(54) LOW RESISTANCE PLATE LINE BUS ARCHITECTURE

(75) Inventors: Sudhir Kumar Madan, Richardson, TX (US); Sung-Wei Lin, Plano, TX (US); John Fong, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 144 days.

(21) Appl. No.: 11/409,628

(22) Filed: Apr. 24, 2006

(65) Prior Publication Data

US 2007/0211510 A1   Sep. 13, 2007

Related U.S. Application Data

(60) Provisional application No. 60/780,613, filed on Mar. 9, 2006.

(51) Int. Cl.
*G11C 11/22* (2006.01)
(52) U.S. Cl. .................. 365/145; 365/63; 365/189.09; 365/230.03
(58) Field of Classification Search ............... 365/63, 365/145, 189.09, 230.03
See application file for complete search history.

(56) References Cited

U.S. PATENT DOCUMENTS

| 5,671,174 | A  | * | 9/1997  | Koike et al. ............... 365/145 |
| 6,473,331 | B1 |   | 10/2002 | Takashima |
| 6,847,539 | B2 | * | 1/2005  | Aoki .......................... 365/145 |
| 6,934,179 | B2 |   | 8/2005  | Shuto |
| 7,269,048 | B2 | * | 9/2007  | Takashima ................. 365/145 |

* cited by examiner

*Primary Examiner*—Hoai V Ho
(74) *Attorney, Agent, or Firm*—Wade J. Brady, III; Frederick J. Telecky, Jr.

(57) ABSTRACT

An FeRAM memory array wherein the plate lines run in the direction of word lines is described that provides a reduced plate line resistance in arrays having a common plate line connection. The lower plate line resistance reduces the magnitude of negative spikes on the plate line to reduce the potential for FeCap depolarization. Two or more plate lines of a plurality of columns of memory cells are interconnected along a bit line direction. Some or all of the plate lines of one or more columns of dummy memory cells may also be interconnected to reduce the plate line resistance and minimize any increase in the bit line capacitance for the active cells of the array. The improved FeRAM array provides a reduced data error rate, particularly at fast memory cycle times.

45 Claims, 15 Drawing Sheets

LOW RESISTANCE PLATE LINE BUS ARCHITECTURE

RELATED APPLICATION

This application claims priority to Provisional application No. 60/780,613 filed Mar. 9, 2006 entitled A LOW RESISTANCE PLATE LINE BUS ARCHITECTURE.

FIELD OF INVENTION

The present invention relates generally to the field of memory devices, and more specifically to a Ferroelectric memory device that provides a reduced plate line resistance in arrays having a common plate line connection, thereby reducing the magnitude of negative spikes on the plate line and the potential for FeCap depolarization.

BACKGROUND OF THE INVENTION

Non-volatile ferroelectric RAM, commonly referred to as FeRAM or FRAM devices and other types of semiconductor memories, are used for storing data and/or program code in personal computer systems, embedded processor-based systems, and the like. FeRAM cells employ a ferroelectric capacitor (FeCap) including a pair of capacitor plates with a ferroelectric material, such as SBT or PZT, serving as the capacitor dielectric situated between them. Ferroelectric materials have two different stable polarization states that may be used to store binary information, where the ferroelectric behaviour follows a hysteresis curve of polarization versus applied voltage. FeRAM memory cells are non-volatile memory devices, because the polarization state of a FeCap remains when power is removed from the device.

Two types of memory cells are used commonly, a single capacitor memory cell and a dual capacitor memory cell. The single capacitor memory cell (a 1T/1C or 1C memory cell) requires less silicon area, thereby increasing the potential density of the memory array, but is less immune to noise, process and cycling variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell generally is more stable than a 1C memory cell.

As illustrated in prior art FIGS. 1A and 1B, a 1T/1C FeRAM cell 100 includes one transistor (also called pass or pass gate transistor) 112 and one ferroelectric storage capacitor 114. The storage capacitor 114 is connected to a source terminal 115 of the transistor 112. The 1T/1C cell 100 is read from by applying an X-axis or word line WL signal to the gate 116 of the transistor, thereby connecting the FeCap 114 to the drain of the transistor at the bit line BL 118. A pulse signal is then applied to the plate line PL 120.

The charge on the bit line 118 of the transistor 112 is, therefore, the FeCAP capacitor charge shared with the bit line capacitance and the potential on the bit line is the charge on the bit line divided by the bit line capacitance. Since the FeCAP capacitor charge is dependent upon the bi-stable polarization state of the ferroelectric material, the bit line potential can have two distinct values. A sense amplifier (see FIG. 3) is connected to the bit line 118 and detects the voltage at a storage node SN 125 of storage capacitor 114 associated with a logic or polarization value of either 1 or 0 of the FeCAP. Frequently, the sense amplifier reference voltage is provided by a "reference cell" (not shown), which comprises a ferroelectric or non-ferroelectric capacitor connected to another bit line that is not being read. In this manner, the memory cell data is retrieved.

As illustrated, for example, in prior art FIG. 1B, a 2T2C memory cell 130 in a memory array couples to a bit line 132 and its complimentary bit line-bar 134 that is common to many other memory types (for example, static random access memories). Memory cells of a memory block are formed in memory rows and memory columns. The 2T2C ferroelectric memory cell comprises two transistors 136 and 138 and two ferroelectric capacitors 140 and 142, respectively. The first transistor 136 couples between the bit line 132 and a first capacitor 140, and the second transistor 138 couples between the bit line-bar 134 and the second capacitor 142. The first and second capacitors 140 and 142 have a common terminal or plate (the plate line PL) 144 to which a signal is applied for polarizing the capacitors.

In a write operation, the first and second transistors 136 and 138 of the 2T2C ferroelectric memory cell 130 are enabled (e.g., via their respective word line 146) to couple the capacitors 140 and 142 to the complementary logic levels on the bit line 132 and the bit line-bar line 134 corresponding to a logic state to be stored in memory. The plate line common terminal 144 of the capacitors is pulsed during a write operation to polarize the 2T2C memory cell 130 to one of the two logic states (a ZERO or ONE).

In a read operation, the first and second transistors 136 and 138 of the 2T2C memory cell 130 are enabled via the word line 146 and the plate line is pulsed (pulse sensing) or stepped to the supply voltage Vdd (step sensing) to couple the information stored on the first and second capacitors 140 and 142 to the bit line 132 and the bit line-bar line 134, respectively. A differential signal (not shown) is thus generated across the bit line 132 and the bit line-bar line 134 by the 2T2C memory cell 130. A sense amplifier (not shown) that provides a signal corresponding to the logic level stored in memory senses the differential signal.

Several additional memory devices have been developed utilizing FeCaps, such as the four transistor (4T) two capacitor (2C) non-volatile (NV) SRAM cell (4T/2C NV SRAM), and the FeCap based reference cell noted above.

Feature sizes of integrated circuits are continuously decreasing in order to increase the packing density and operating speed of the various semiconductor devices formed thereby. As feature sizes continue to shrink, however, the resistance of various metal lines and interconnects also increase that may induce conductive noise problems, particularly at high signal transition rates. Accordingly, although FeRAM arrays provide a near ideal NVM memory storage mechanism, as scaling trends continue, increased data error rates may also be observed in FeRAM devices, particularly at fast memory cycle times.

In addition, with these scaling trends, one semiconductor fabricating process that experiences unique challenges is photolithography. Photolithography involves selectively exposing regions of a resist-coated silicon wafer utilizing a reticle (often called a mask) that includes a pattern thereon corresponding to features to be formed in a layer on the substrate.

It is well known in the art of photolithography that light passing through the reticle is refracted and scattered by the edges of the chrome mask patterns of the reticle, causing the projected image to exhibit some rounding and other forms of optical distortion. These optical distortions can increase the maximum resistance of a metal line and may cause an increase of data error rate. As feature scaling trends continue, variations of feature critical dimensions may no longer be ignored in present day circuit layouts. The problem highlighted above becomes even more pronounced in integrated circuit designs having submicron feature sizes near the wavelength of the radiation employed in the photolithographic process.

In addition, the diffraction and scattering of the radiation in the distorted illumination pattern propagates through the developed resist pattern and negatively impacts the integrated circuit features, such as polysilicon gate regions, vias in dielectrics, etc. As a result, integrated circuit performance is often degraded.

To mitigate this problem, a reticle correction technique known as optical proximity correction (OPC) has been developed and applied to portions of a reticle to mitigate the distorting effects of diffraction and scattering.

Various corrections or modifications are made to the base features of the design layout to compensate for the optical distortions produced by the imaging effects. In addition, variations in the photoresist and other such imaging material processing cause damage to the features as fabricated, and degradations from the layout design add to the CD variation and failure rate of a targeted CD for a feature. Imaging material processing is complex and difficult to model in OPC designs. Further, other post patterning processes such as etch and cleaning operations are equally difficult to model in OPC designs and cause substantial CD variation of the desired features.

Because these difficulties may persist in the best of OPC models and such methods may not provide adequate correction for the various processes, dummy rows and columns of repeating features are often beneficially used around the edges or boundary of the core region of memory arrays. Dummy rows and dummy columns placed at the edges of memory arrays help maintain the same pattern uniformity as the adjacent interior rows and columns of array features or elements. For a typical memory array, a dummy row may comprise a dummy wordline and plate line as well as the associated dummy memory cells and select circuits, while a dummy column may comprise a dummy bit line (or a pair of dummy bit lines) as well as the associated sense amplifier circuit and dummy memory cells. During memory array operations, dummy rows and columns are typically deactivated, as these dummy elements usually do not represent the operational characteristics of the interior or core region rows and columns of the array.

In spite of using dummy columns and rows and utilizing special OPC design considerations in the manufacture of semiconductor devices, there is a need for an improved FeRAM array that provides a reduced data error rate, particularly at fast memory cycle times.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to an improved FeRAM memory array that provides a reduced plate line resistance for arrays having a common plate line connection or a driver. The plate lines that have a common plate line driver are also referred to as plate line group. Use of the common plate line driver for several plate lines is known to save chip area and is commonly used in the current FeRAM circuits. Typically an array of FeRAM with 512 word lines may have 8 or 16 plate groups or drivers. The lower plate line resistance reduces the magnitude of negative spikes on the plate line to reduce the potential for FeCap depolarization. This situation is particularly likely and problematic, for example, when writing a ZERO state to one cell while writing a ONE to many other of the cells on a plate line.

In accordance with the present invention, the resistance of the plate lines running in a row or word line direction may be lowered by adding one or more plate line interconnections in the column or bit line direction. Two or more plate lines of one or more columns of memory cells are interconnected along the bit line direction. Further, some or all of the plate lines of one or more columns of dummy memory cells may also be interconnected in the bit line direction to reduce the plate line resistance and minimize any increase in the bit line capacitance for the active cells of the array. Thus, the improved FeRAM array provides a reduced data error rate, particularly at fast memory cycle times.

In one implementation of the present invention, the array comprises a plurality of FeRAM memory cells arranged in rows of memory cells along a word line direction and columns of memory cells along a bit line direction. A cell may comprise a 1T1C cell or it may comprise a pair of 1T1C cells. The 1T1C cells in a pair may belong to one 2T2C cell or they may belong to two different 2T2C cells of a 2T2C FeRAM, or be two different 1T1C FeRAM cells. The plate lines of a cell (pair of 1T1C cells) are adjacent in the direction of the word lines. The array is generally referred to as a group of cells associated with a plate line group.

The array further comprises a plurality of plate lines associated with the rows of memory cells, wherein the plate lines from adjacent cells in a row are arranged adjacent to each other, a common plate line driver connected to, and configured to drive the plurality of plate lines, and first and second memory cells of a first column of memory cells arranged adjacent to each other in a bit line direction. A plate line of the first memory cell is connected to a plate line of the second memory cell, thereby providing a FeRAM memory array having a reduced plate line resistance. The connections between two plate lines in the direction of bit lines is generally referred to as a plate line interconnect or interconnection, or cross-connection.

The array of the present invention is applicable to FeRAM devices and other such memory technologies and architectures having a plurality of common plate lines, a common plate line driver, and storage capacitors.

The inventors of the present invention have determined that a negative voltage spike produced along a plate line shared by multiple memory cells, caused depolarization of the FeCap while writing a ZERO to the cell, particularly when a large number of other cells along the plate line were written with a ONE. The inventors appreciated that this negative voltage spike was produced by the distributed resistance of the plate line. This conclusion was not fully appreciated, however, until it was observed that the negative spike has the greatest amplitude in a worst case situation, for example, when the ZERO is written into the cell furthest from the common plate line driver connection.

In another aspect of the invention, the FeRAM array further comprises some or all of the plate lines of one or more columns of dummy memory cells interconnected along the bit line direction. Beneficially, the use of dummy cells reduces the plate line resistance and minimizes any increase in the bit line capacitance for the active cells of the array.

In yet another aspect of the present invention, the column of dummy cells is located on the opposite side of the array from the common plate line driver interconnection to the plurality of plate lines, and wherein two or more plate lines of the plurality of plate lines associated with the dummy cells are interconnected. Further, a second column of dummy cells may be located on each side of the array.

In still another aspect of the present invention, two or more adjacent columns of memory cells, comprising several plate lines having a common plate line driver, wherein the adjacent columns each comprise two adjacent memory cells having plate lines interconnected to each other in the bit line direction. Further, each column comprises two more adjacent memory cells having plate lines that are not interconnected to each other in the bit line direction, wherein the interconnections within the columns are offset from one another along the bit line direction. In other words, the plate line interconnections or cross-connections are staggered with respect to each other over the active cells, in order to minimize any increase in the bit line capacitance for the active cells.

In another aspect of the present invention, the plate line interconnection is made on the same metal layer as the plate line, for example, the Metal 1 (M1) layer. Alternately, the plate line interconnection (bit line direction) may be made on a metal layer other than the layer used for the plate lines (row direction).

In still another aspect of the invention, the plate lines of adjacent active cells associated with a plate group connect in both the bit line and word line directions, thereby forming a grid of plate line interconnections throughout the array. In yet another aspect of the present invention, the common plate line driver connections to the plurality of plate lines are made on a metal layer other than the layer used for the plate lines.

In another aspect, the plate line interconnection is made outside the memory array region on the opposite side of array from the common plate line driver.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
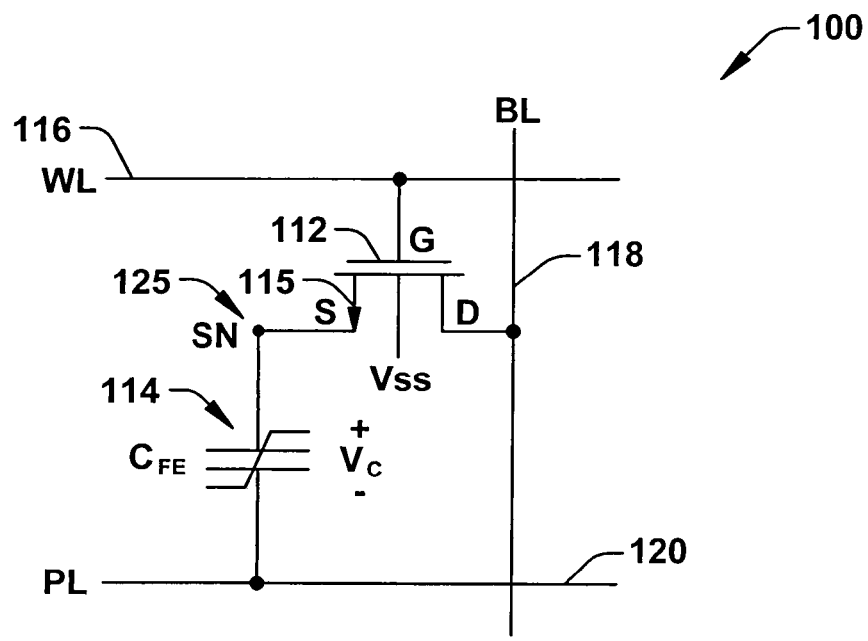
FIG. 1A is a partial schematic diagram of an example prior art 1T1C FeRAM memory cell such as may be used in accordance with the present invention, the cell comprising one transistor and one ferroelectric capacitor.
Figure 1B:
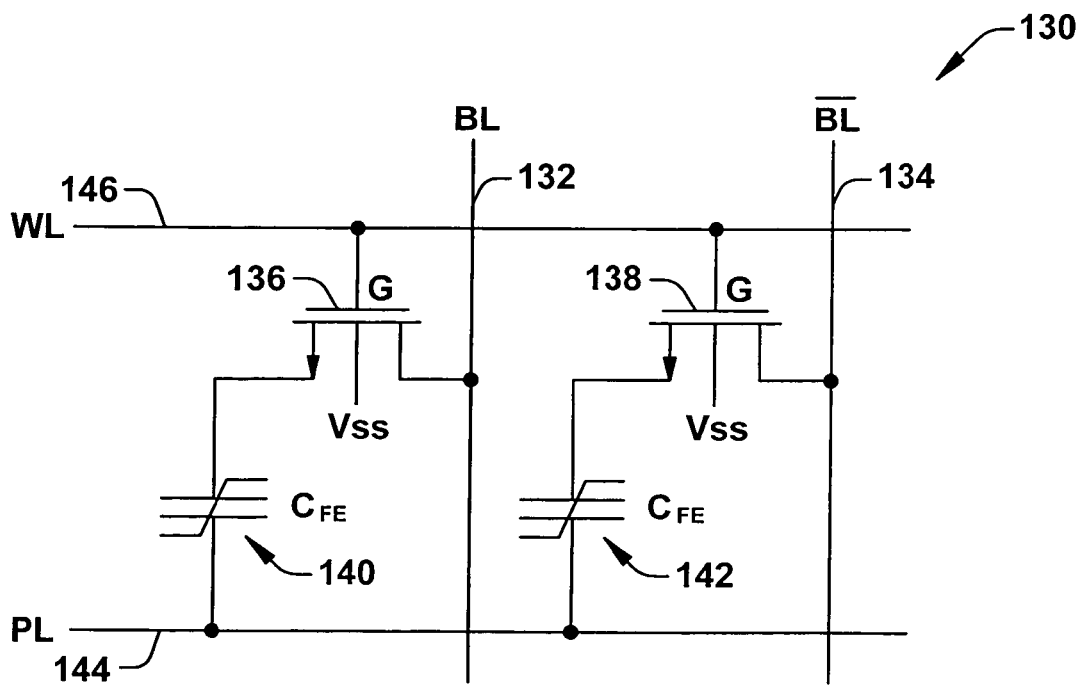
FIG. 1B is a partial schematic diagram of an example prior art 2T2C FeRAM memory cell such as may be used in accordance with the present invention, the cell comprising two transistors and two ferroelectric capacitors.

The present invention will now be described with reference to the attached drawings, wherein like reference numerals are used to refer to like elements throughout. The invention provides an improved FeRAM memory array and other such memory devices having a common plate line connection to provide a reduced plate line resistance. The lower plate line resistance reduces the magnitude of negative spikes on the plate line during write operations to reduce the potential for FeCap depolarization, for example, when writing a ZERO state to one cell while writing a ONE to a significant number of other cells along an associated plate line. The resistance of the plate lines running in a row or word line direction, in accordance with the present invention, may be lowered by adding one or more plate line cross-connections (interconnections) in the column or bit line direction, thereby shorting between the plate lines of adjacent cells of the column. Two or more plate lines of one or more columns of memory cells are interconnected along the bit line direction. Additionally, some or all of the plate lines of one or more columns of dummy memory cells may also be interconnected in the bit line direction to further reduce the plate line resistance and to minimize any increase in the bit line capacitance for the active cells of the array.

Thus, the reduced plate line resistance of the improved FeRAM array provides a reduced data error rate, particularly at fast memory cycle times. This is because the amplitude of the negative voltage spike on the plate line is a function of the rate of change of all the ONE write discharge currents to the cells on the plate line when all the bit lines are discharged to ground at the end of an access cycle as well as the total resistance of the plate line.

Example implementations are hereinafter illustrated and described in the context of providing an improved FeRAM memory array and other such memory devices, wherein the memory cells are protected from negative voltage spikes on the plate line of the array during write operations in order to reduce the potential for FeCap depolarization, by reducing the plate line resistance in a common plate line ferroelectric memory array, and wherein the structures illustrated are not necessarily drawn to scale. It will be appreciated that the invention may be employed in FeRAM, as well as in DRAM and other such common plate line memory devices and memory technologies apart from the example devices described and illustrated herein. These and other benefits will become more apparent as the following figures are described. The following discussion will further establish some of the problems and issues relating to high layout density associated with FeRAM device designs used in wafer and device fabrication.

As semiconductor device scaling continues, and as previously discussed, columns or rows of dummy memory cells are often used around the edge or boundary of a memory array to mitigate inadequacies in even the best OPC models that may not provide adequate correction for post processing such as etch and clean processes or imaging material processing such as photoresist processes used in the fabrication of semiconductor devices.

Figure 2:
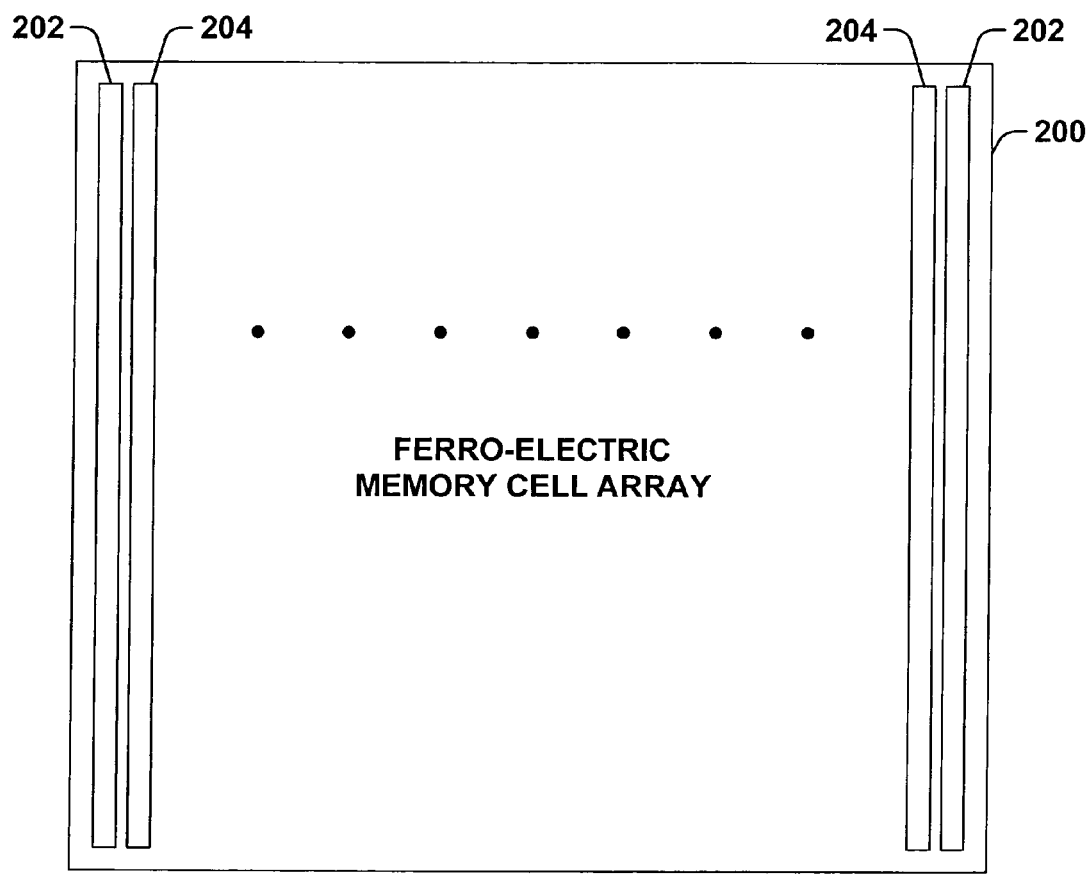
FIG. 2 is a partial plan view of a core region of a FeRAM array, wherein dummy bit lines are utilized and illustrated on both edges of the array to mitigate processing and imaging correction difficulties.

FIG. 2, for example, illustrates a core region 200 of a FeRAM array, wherein dummy cells are utilized on the edges or boundaries of the array to mitigate processing and imaging correction difficulties. The core region 200 comprises an array of memory cells arranged in a plurality of columns of cells arranged along bit lines, and a plurality of rows of cells arranged along word lines. The plurality of columns, for example, comprises one or more exterior or edge columns 202 and a plurality of interior columns 204. Each of the plurality of columns may comprise a plurality of memory cells, a pair of complimentary bit lines, a sense amplifier circuit, and associated switching and isolation circuitry. The plurality of columns 202 and 204, are generally intended to be patterned identically, however, the cells of the edge columns 202 are unused and as such are referred to as columns of dummy memory cells arranged along a dummy bit line within dummy columns 202. The use of the dummy columns 202 avoids the use of special OPC conditions at the core boundaries by maintaining the same pattern uniformity as the adjacent interior cell columns 204.

Figure 3:
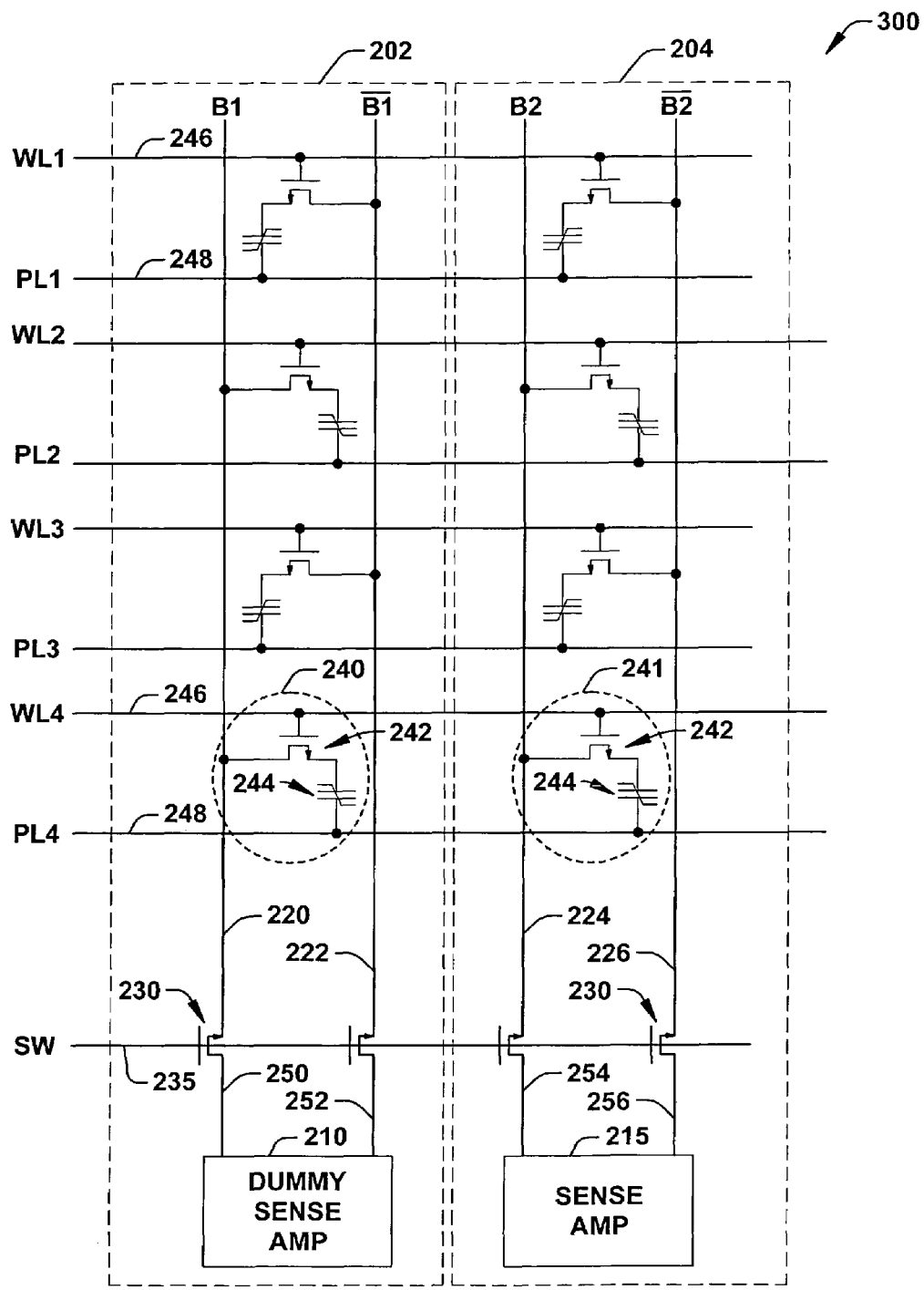
FIG. 3 is a simplified schematic illustrating an array portion of the prior art 1T1C memory cell structure of FIG. 1A.

For example, FIG. 3 illustrates an array portion 300 of the prior art 1T1C memory cell structure of FIG. 1A. FIG. 3 also illustrates further details of the dummy columns 202 and the interior (active or conventional) columns 204. Array portion 300 has a plurality of element groupings arranged in columns which operate together in a modular fashion to read and write to memory cells. FIG. 3, for example, shows a dummy column element grouping 202 and an interior 30 column element grouping 204. In accordance with the present invention, the dummy column 202 topographically duplicates the interior columns 204 to avoid special OPC conditions; however, most cell and sense functions of the dummy column 202 are disabled. The column or element groupings comprise a dummy sense amplifier 210, which is used to ground a pair of dummy bit lines B1 220 and B1-bar 222 associated with a dummy memory cell 240, while a conventional sense amplifier 215 is used to sense a memory cell 241 associated with a pair of conventional bit lines B2 224 and B2-bar 226, respectively. The memory cells are accessed by one of a plurality of word lines 246 (W1-W4) and plate lines 248 (PL1-PL4), with each word line and associated plate line activating a 1T1C dummy memory cell 240 and accessing a memory cell 241.

Dummy column 202, for example, comprises a dummy sense amplifier 210, coupled to a pair of dummy bit lines B1 220 and B1-bar 222 through a set of bit line isolation transistors 230 controlled by an isolation switch line 235, to permit isolation of the dummy bit lines from the dummy sense amplifier 210. The 1T1C dummy memory cell 240 comprises a pass gate transistor 242 and a ferroelectric capacitor 244, which is accessed by its respective word line 246 and plate line 248. Bit line isolation transistors 230 isolate the local dummy bit lines (B1 220 and B1-bar 222) from the dummy sense amplifier bit lines DSABL 250 and 252 at the dummy sense amplifier 210. Although some functions are described above in the context of the dummy column 202, only the conventional internal columns 204 are fully functional in the present invention, while most cell and sense functions of the dummy column 202 are disabled.

Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric capacitors (FeCaps) adapted to store a binary data bit, as well as one or more access transistors, typically MOS devices, operable to selectively connect the FeCap to a bit line or one of a pair of complimentary bit lines, with the other bit line being connected to a reference voltage. The individual FeRAM cells are commonly organized as individual bits of a corresponding data word, wherein the cells of a given word are accessed concurrently through activation of plate lines and word lines by address decoding circuitry.

Data in a 1T1C ferroelectric memory cell is read by connecting a reference voltage to a first bit line, connecting the cell capacitor between a complimentary bit line and a plate line signal voltage, and interrogating the cell. There are several techniques to interrogate a FeRAM cell. Two most common interrogation techniques are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage is typically supplied at an intermediate voltage between a voltage associated with a capacitor programmed to a binary "0", and that of the capacitor programmed to a binary "1". The resulting differential voltage at the sense amp terminals represents the data stored in the cell, which is buffered and applied to a pair of local IO lines.

The transfer of data between the FeRAM, the sense amp circuit, and the local IO lines is controlled by various access transistors, typically MOS devices, with switching signals being provided by control circuitry in the device. In a typical ferroelectric memory read sequence, two sense amp bit lines (e.g., 254 and 256 in the FIG. 3) are initially pre-charged to ground, and then floated, after which a target ferroelectric memory cell is connected to one of the sense amp bit lines and interrogated. Thereafter, a reference voltage is connected to the remaining sense amp bit line, and a sense amp (e.g., 215 of FIG. 3) senses the differential voltage across the bit lines and latches a voltage indicative of whether the target cell was programmed to a binary "0" or to a "1".

A FeRAM memory is typically organized as a block or a set of blocks. Each block may contain several sections and each section typically comprises several segments. A segment is organized as a set of R rows and C columns. In a folded bit line configuration, each column consists of a pair of bit lines. Rows define the direction of word lines, with plate lines running parallel to the word lines. In some of the most recent FeRAM memory devices, several adjacent plate lines are shorted together forming a plate group that may be driven by a common plate line driver. In this way, the total number of plate line drivers needed is reduced, thereby saving wafer area. To reduce the number of WL drivers, a word line driver may be common to several or all segments in a section.

In one example of the present invention, a 6 Mb FeRAM is utilized. In this memory array, there are two blocks with 3 Mb each. Each block comprises six 512K sections. Each section has 16 segments with 32K 1T1C cells. Each segment has 512 rows and 64 columns. Each segment can also be configured as 16K 2T2C cells with 256 rows and 64 columns. There are 8 plate groups in each segment and each plate group is associated with 64 (1T1C) or 32 (2T2C) word lines. A folded bit line architecture is used, wherein each column comprises two bit lines. One bit line is connected to the FeCap to be sensed through the pass gate and the other is connected to a reference voltage for 1T1C operation.

Figure 4:
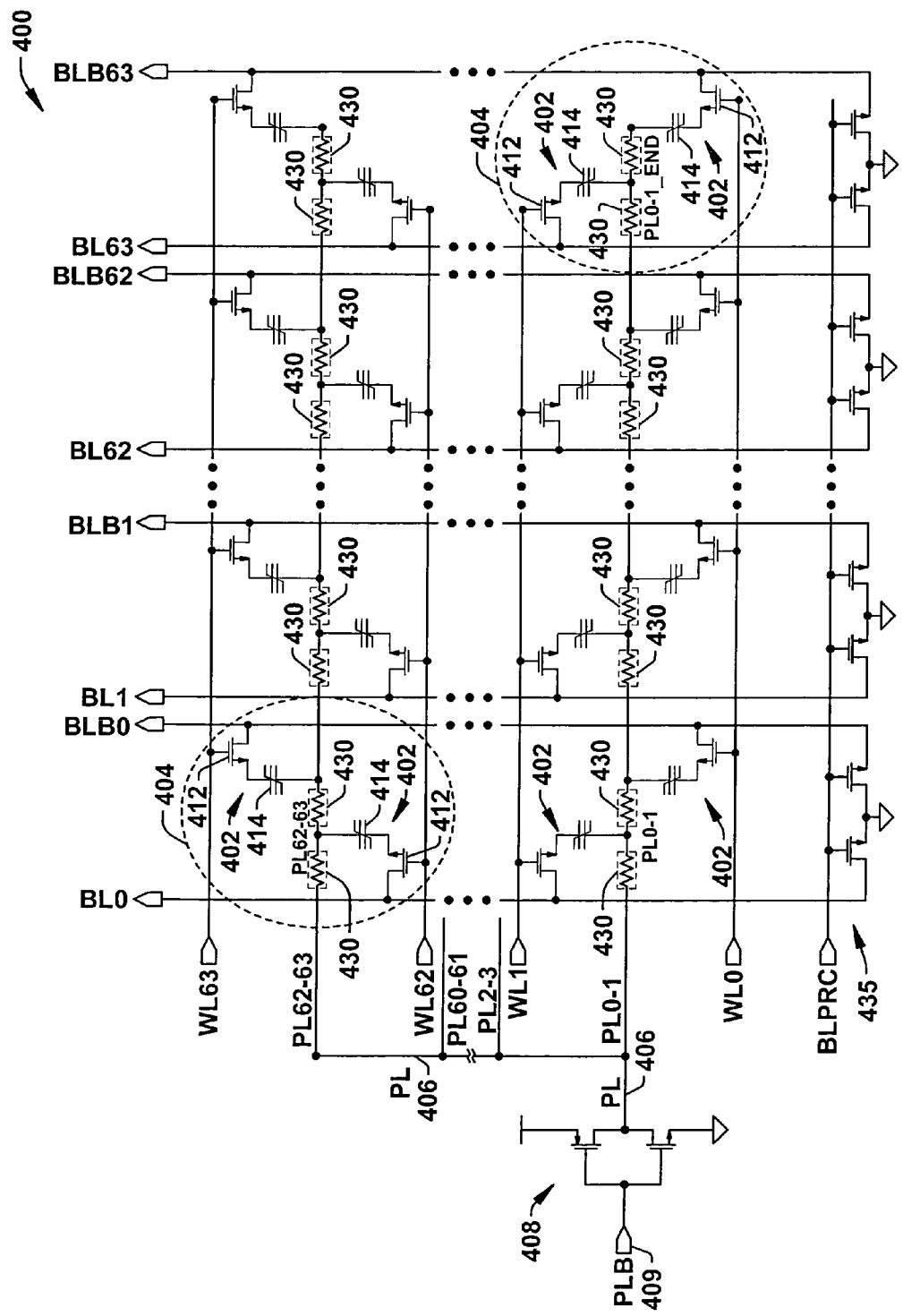
FIG. 4 is a partial schematic diagram of an example 1T1C FeRAM memory array portion having a common plate line and common plate line driver configuration and using a folded bit line architecture such as may be used in accordance with the present invention, the array demonstrating the effect of a distributed plate line resistance.

For example, FIG. 4 illustrates a partial schematic diagram of an example 1T1C FeRAM memory array portion or plate group 400, having a common plate line and common plate line driver configuration such as may be used in accordance with the present invention. Array plate group 400 comprises a plurality of FeRAM cells 402 (e.g., similar to cell 100 of FIG. 1A) organized in rows of memory cells along a word line direction and columns of memory cells along a bit line direction. Array plate group 400 further comprises a plurality of plate lines PL 406 and word lines WL0-WL63, associated with the rows of memory cells 402. Plate group 400 also illustrates the folded bit line architecture, further comprising a plurality of complimentary bit lines BL0-BL63 and bit lines-bar BLB0-BLB63, associated with the columns of memory cells.

In the array architecture illustrated, there are 32 plate lines PL0-1 thru PL62-63 (e.g., in the MET1 or M1 metal layer) per plate group 400 running parallel to the word lines for the 64 word lines, thereby saving chip area by having one plate for a pair of word lines. The bit lines run perpendicular to the plate lines, for example, in the MET2 or M2 metal layer. Thus, two rows of cells (e.g., 1T1C cells) associated with two word lines share a single plate line. For example, WL0 and WL1 are associated with two rows of cells 402 at the bottom of the plate group 400 sharing a single plate line PL 0-1, while WL62 and WL63 are associated with two other rows of cells 402 at the top of the plate group 400 sharing another single plate line PL 62-63.

For example, this plate line sharing may be better understood by observing that a complementary cell pair 404 comprises two FeRAM cells 402, wherein each FeRAM cell 402 comprises a pass transistor 412 and a FeCap 414. Both of the two cells 402 of cell pair 404 share one of the plurality of plate lines PL 406. 64 such cell pairs 404 are arranged along each plate line. Cell pair 404 will also be referenced later in association with a layout of the array, wherein cell pair 404 represents a mirrored pair of adjacent cells arranged along a row and plate line.

Array plate group 400 further comprises a common plate line driver 408 connected to, and configured to drive the plurality of plate lines (common plate line) PL 406 using a plate line-bar signal PLB 409. In the example array portion 400, the plurality of plate lines are shorted outside the core region of the array, by, or at the plate line driver 408, thereby forming the common plate line PL 406.

As indicated previously, with feature scaling, the resistance of metal lines and conductors increases correspondingly. For example, the total resistance of a single plate line PL 406 may be seen as a distribution of plate line resistors 430 and conductors along the length of a plate line, for example, plate line PL 0-1. During write operations, each cell 402 of the 64 cell pairs 404 produces another load current that conducts thru one or more resistances 430 distributed within the plate line between the plate line driver and the cell FeCap. The end result is that the sum of all the ONE write discharge currents "I" thru all the distributed plate line resistances "R", produces an accumulative I×R voltage drop on the plate line. This plate line voltage drop produces a negative voltage spike on the plate line that tends to depolarize the FeCap of cells that are written with a ZERO state. The greatest resistance, and therefore the greatest voltage drop along the plate line, may be found at the end furthest from the common plate line driver 408, for example, at PL0-1_END between BL63 and BLB63.

FIG. 4 further illustrates a plurality of pairs of bit line precharge BLPRC transistors 435, which discharge to Vss or precharge to Vss for the next access cycle the bit line and bit line-bar of each column of memory cells during memory write operations, when instructed by the BLPRC signal after ONE's are written in the memory cells.

Figure 5:
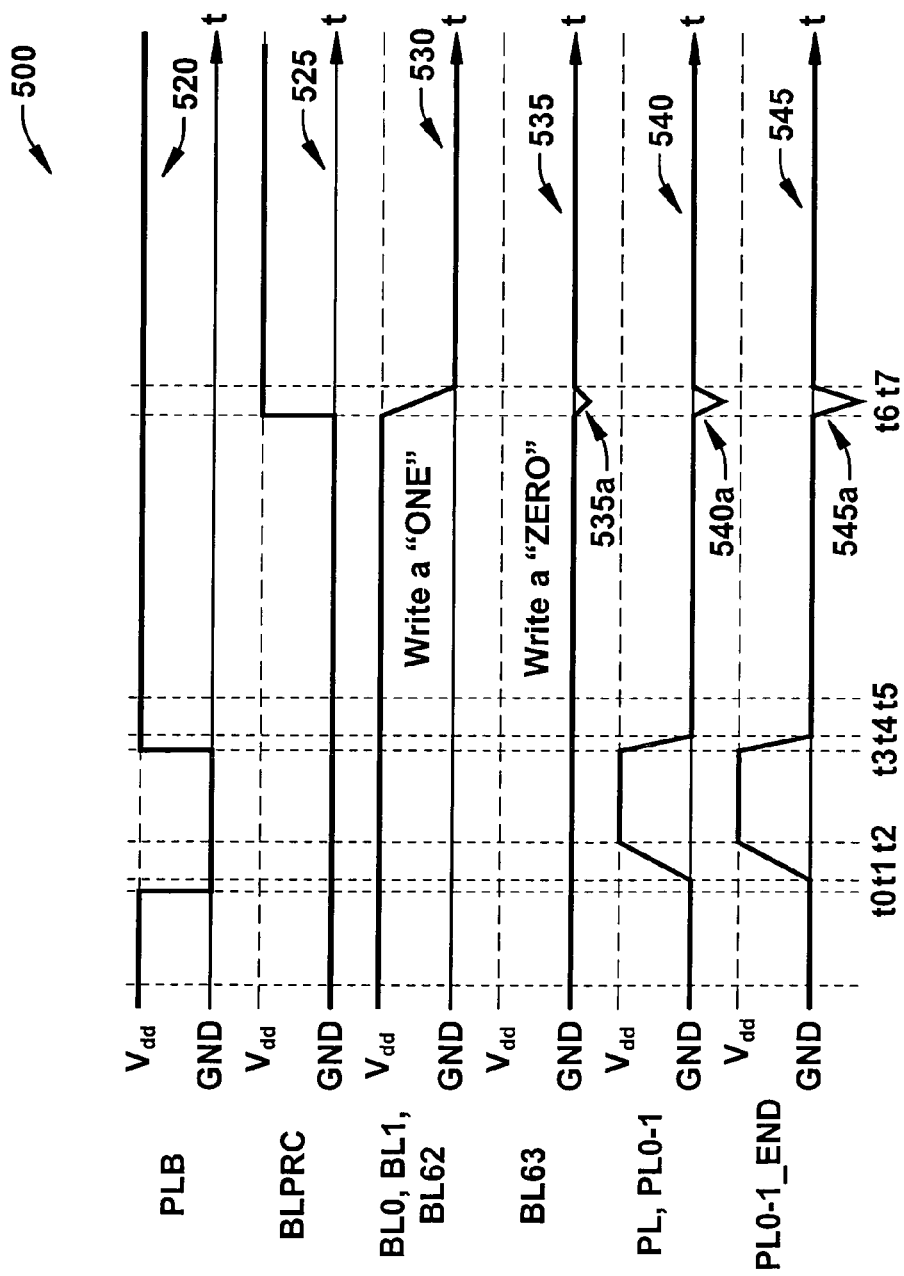
FIG. 5 is a timing diagram for a memory write operation; wherein a negative voltage spike may occur on a plate line of the 1T1C FeRAM memory array of FIG. 4 as a result of the voltage drop across the plate line resistances and may depolarize an FeCap of the array.

For example, FIG. 5 illustrates a timing diagram of a prior art memory write operation 500 for cells in a accessed segment, wherein a negative voltage spike may occur on a plate line of a 1T1C FeRAM memory array such as array portion 400 of FIG. 4 as a result of ONE write discharge current induced voltage drop across a plate line.

To access a word in a FeRAM segment, a word line is turned ON and a plate group associated with that word line WL is pulsed high (e.g., to a voltage which is typically VDD plus the threshold voltage of the pass transistor). Pulsing the plate group high associated with the selected cell, results in a voltage developed on the bit line associated with the accessed cell, because the FeCap discharges it's charge through the pass gate onto the bit line. Subsequently, after the signal is amplified by the sense amplifier and during the write phase, the bit line voltage may rise to Vdd if a ONE state is written in the accessed cell, or the bit line may go to Vss if a ZERO state is written in the accessed cell.

As previously discussed in connection with FIG. 4, write operation 500 represents a worse case condition, wherein a ONE is written to all the columns along a plate line PL0-1 except the last column, and a ZERO is written to the last column or cell at the furthest end of the plate line PL0-1_END (cell 0_63 connected to BLB63). This condition creates the greatest combined write discharge current through all the cells, and places the cell storing the ZERO state furthest from the common plate line driver 408, where the greatest amount of voltage spike occurs. Since the bit line is held at ground when writing a ZERO state, any negative spike on the plate line will cause FeCAP depolarization to the ZERO state previously stored. In other words, the following considers this worse case when the column written with a ZERO is on the opposite side of the segment to that of the plate line driver 408, and all other columns are written with a ONE state. If the columns are numbered 0 to 63, and the plate line driver is next to column 0, then the columns 0 to 62 would have a ONE written, and column 63 would have a ZERO written.

During a restore/write period in a memory cycle, the selected word line is ON and the plate line is pulsed from Vss to a high state and back again to Vss, while the bit line is held at Vss for writing a ZERO as illustrated in FIG. 5. for times t1 to t4. To write a ONE, the bit line need only be at VDD while the plate line is held at Vss as illustrated in FIG. 5 during times t5 to t6. When the writing of a ONE is complete, the bit lines are discharged to Vss while the plate line is held at Vss (times>t6 in FIG. 5). However, when bit line discharges to Vss, it causes a negative spike in the plate line voltage along the length of the plate line, due to the finite resistance of the metal line. The amplitude of the negative spike will increase further away from the plate line driver. A larger number of ONE's stored in a word (e.g., 64 columns), tends to produce a larger negative spike amplitude. This effect is greatest for column 63, wherein a ZERO is stored, and may depolarize the FeCap in this column. Depolarization of an FeCap may degrade the signal level when it is subsequently accessed. For example, simulations show that the plate line can dip as much as 132 mV at typical operating voltages.

Memory write operation 500 begins at time t0, wherein the plate line bar signal PLB 520 pulses low at the input of the common plate line driver 408. In response, at time t1, the common plate line PUPL0-1 540, at the driver 408 side of the array, and PL0-1_END 545, at the furthest end of the plate line, is pulsed high by driver 408. At time t3, the PLB 520 pulse input returns to a high state, and common plate line PUPL0-1 540 and PL0-1_END 545 is driven back to a low state by driver 408.

Also at time t3, bit line BL63 (535) is held at Vss for writing a ZERO and at time t4, bit lines BL0, BL1 . . . BL62 (530) are held at Vdd (by time t5) for writing a ONE. At time t6, when the writing of the ONE is complete, BLPRC 525 goes high, which turns ON BLPRC transistors 435 of FIG. 4, and discharges all the bit lines of the plate group to Vss while the plate line is held at Vss. However, when bit lines BL0, BL1 . . . BL62 (530) discharge to Vss, it causes a negative spike 540a and 545a in the plate line voltage 540 and 545, respectively, along the length of the plate line at PL0-1 and PL0-1_END, respectively, due to the finite resistance of the metal line. It should be noted that the amplitude of the negative spike 545a on plate line signal PL0-1_END in column 63 is greater than that of spike 540a on plate line signal PL0-1 in column 0. The bit line signal BL63 (535) also receives a small negative spike 535a because of the capacitive coupling from the plate line to the storage node and to the bit line through the pass gate which is ON and because the transistors hold the bit line to Vss having finite resistance. By time t7, the bit line signal 530 has returned to Vss, as the write current from writing the ONE states to all the cells ceases, thus the negative voltage spikes at 535a, 540a, and 545a also cease. The bit line being more positive than the plate line voltage during times t6 and t7 can potentially cause FeCAP depolarization.

Thus, a goal of the present invention is to reduce the resistance of the plate line in order to lower the write current induced negative voltage spike on the plate line. Accordingly, the inventors of the present invention present several interconnection structures at various places in the array to reduce the plate line resistance, particularly useful at the locations in the array furthest from the common plate line driver.

Figure 6A:
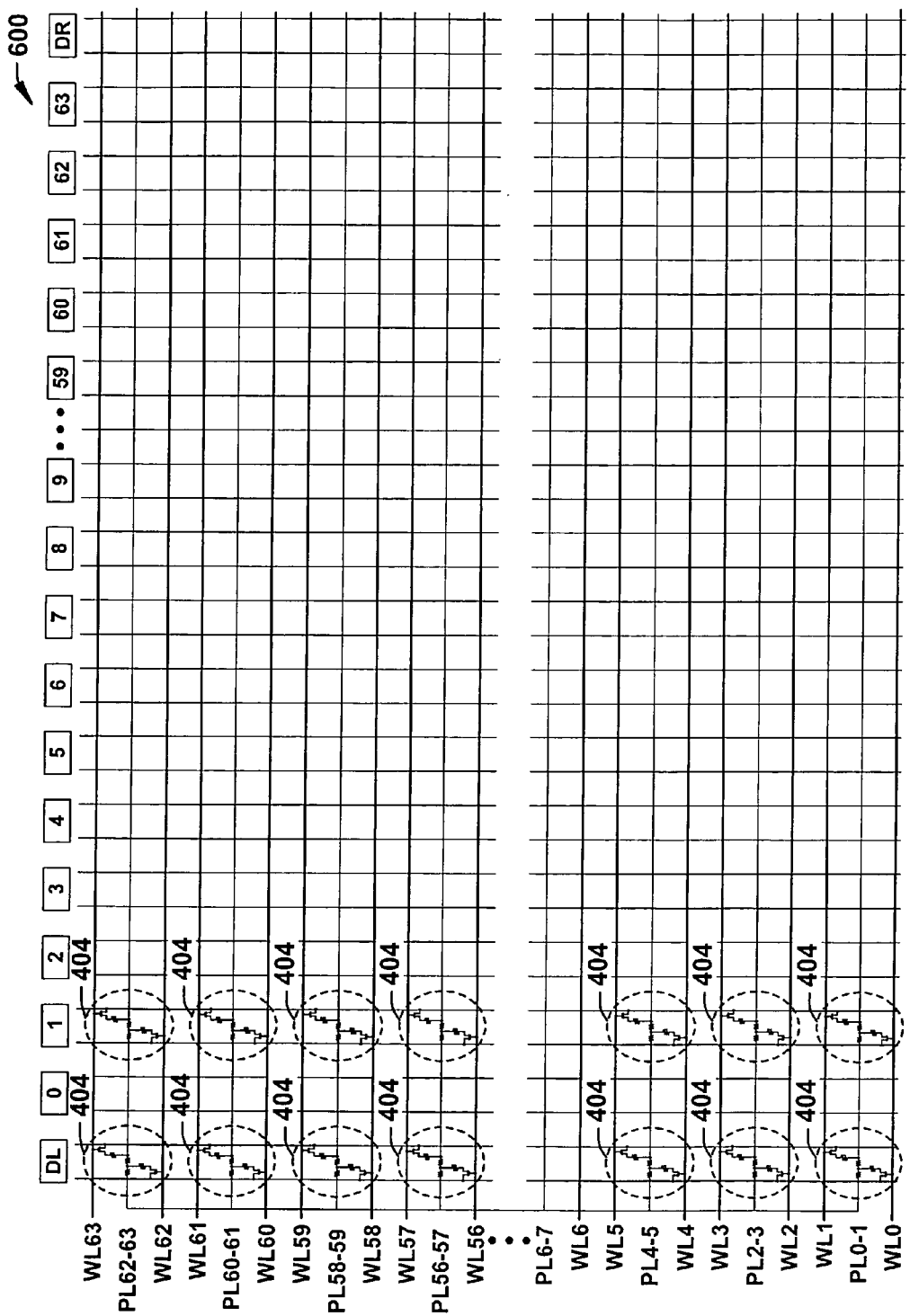
FIGS. 6A-6D are partial schematic diagrams of a simplified example 1T1C FeRAM array portions similar to the array portion of FIG. 4 including dummy columns of cells at the edges of the array, active columns of cells in the core region of the array, word lines and plate lines, and various example combinations of plate line interconnection structures including interconnections within some or all of the dummy columns or the active cell columns, used in accordance with the present invention to reduce the plate line resistance.
Figure 6B:
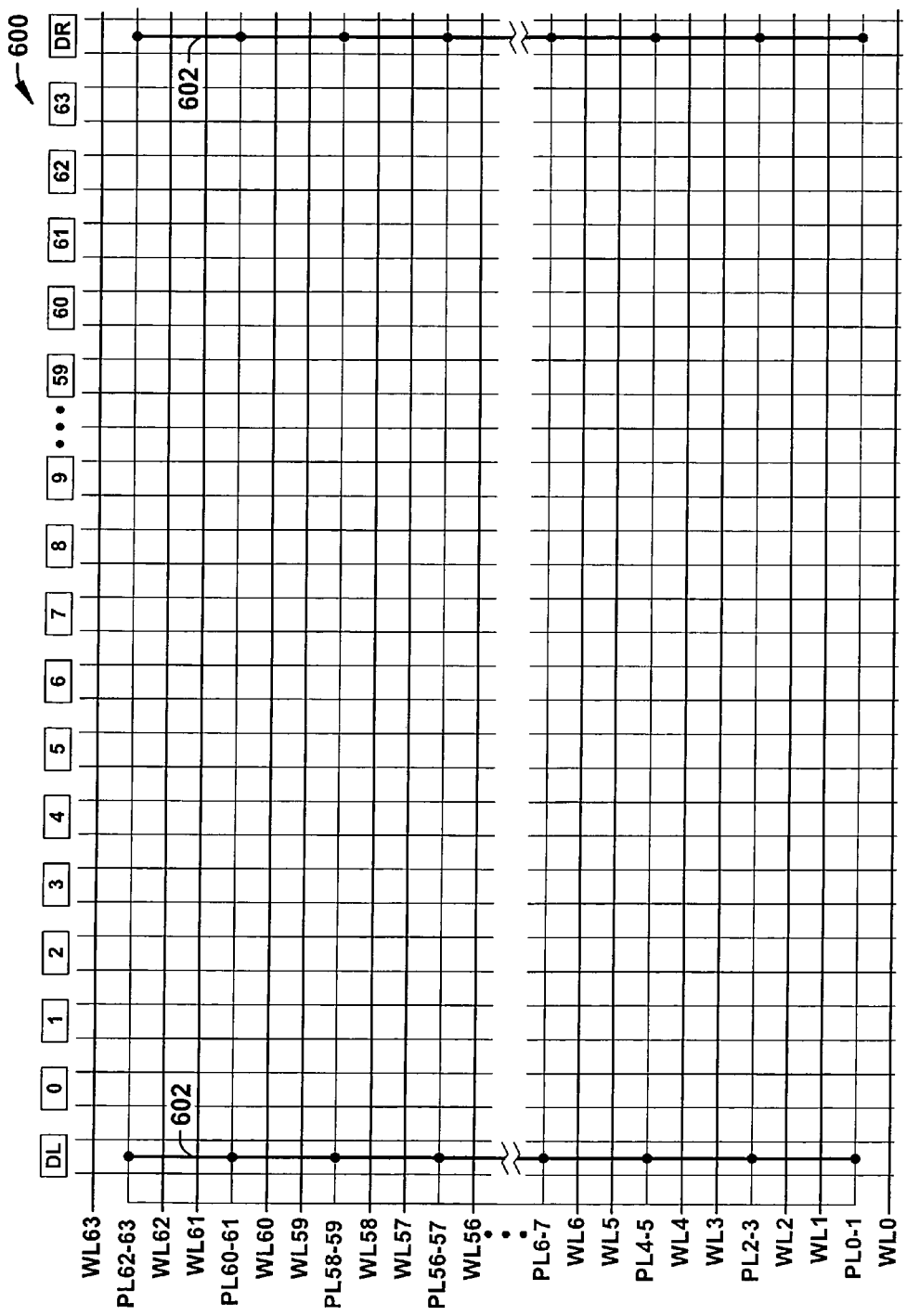
Figure 6C:
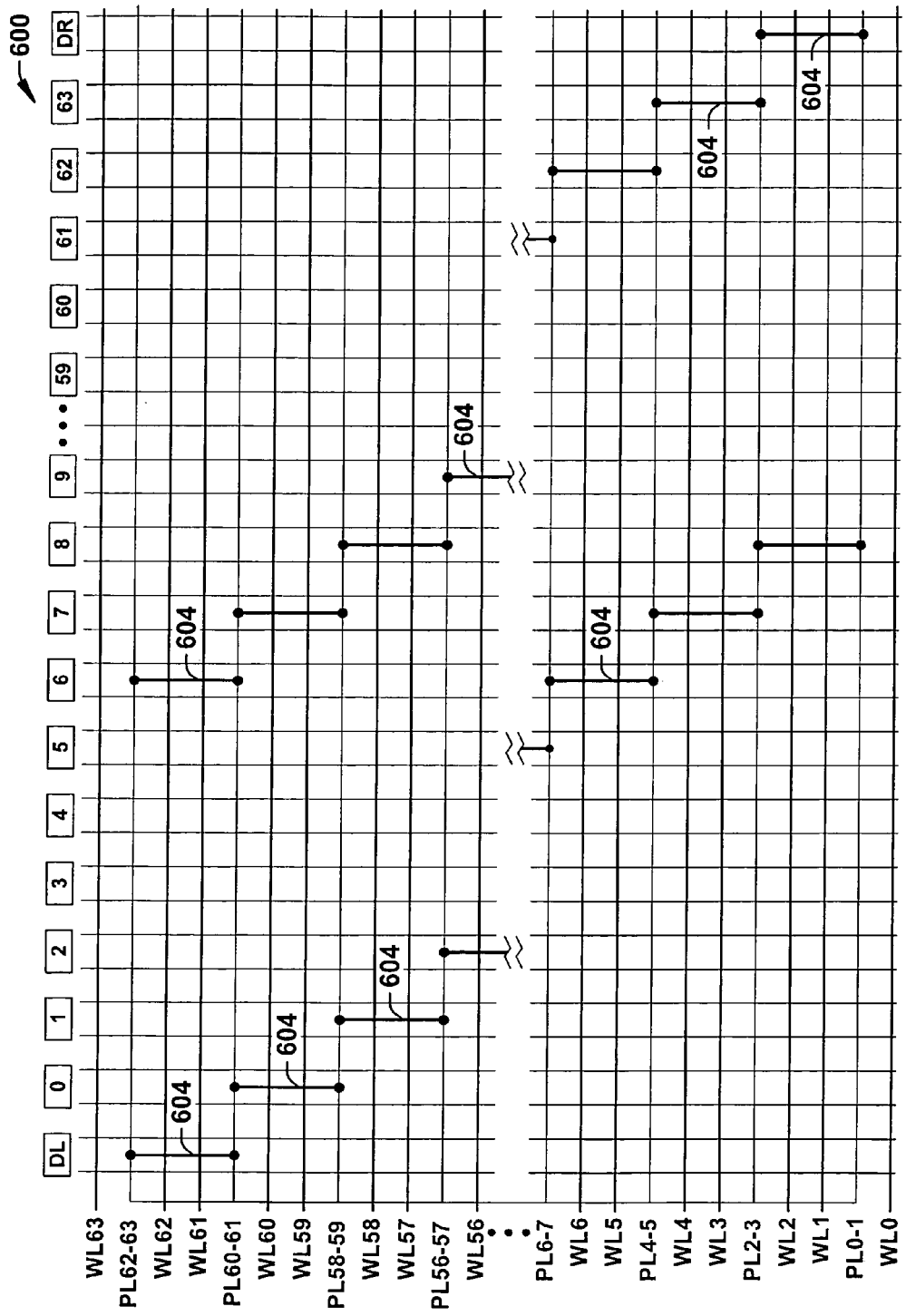
Figure 6D:
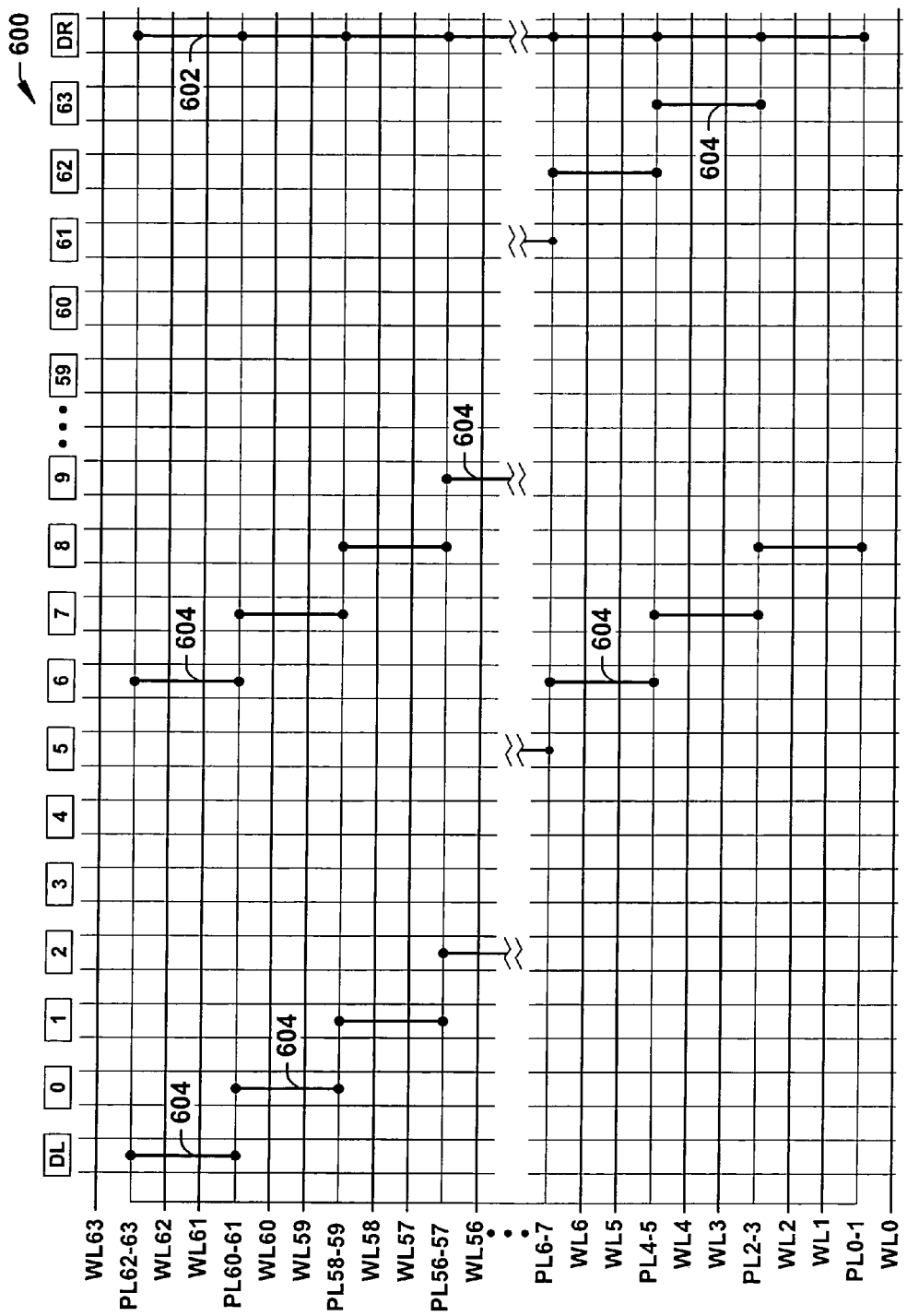

For example, FIGS. 6A-6D illustrate a simplified example 1T1C FeRAM array portion 600 similar to the array portion 400 of FIG. 4, used in accordance with the present invention to reduce the plate line resistance. Array portion 600 also illustrates dummy columns of cells at the edges of the array (e.g., dummy column left DL at the left edge of the array, and dummy column right DR at the right edge of the array 600), active columns 0-63 of cells in a core region of the array, word lines WL0-WL63 and plate lines PL0-1 to PL62-63. FIGS. 6B-6D further illustrate various example combinations of plate line interconnection structures (along the bit line direction) including interconnections within some or all of the dummy columns or the active cell columns 0-63 applied to the array portion 600, used in accordance with the present invention to reduce the plate line resistance.

For example, FIG. 6A illustrates a simplified conventional 1T1C FeRAM array portion 600 shown with several example 1T1C FeRAM cell pairs 404, the array portion 600 shown without plate line interconnections.

One goal of the present invention is to reduce the negative spikes on the plate lines in order to lower the resistance of the 32 plate lines running in the row or word line direction, by adding cross lines or plate line PL interconnections in the column or bit line direction in the MET1 layer. However, to minimize causing an increase in the bit line capacitance in the MET2 layer due to inter layer MET1 and MET2 capacitance, and an imbalance in the capacitance of a bit line pair due to photolithographic mis-alignment, the PL interconnects do not run continuously or across every cell in a column unless the PL interconnects are located away from the active cells, such as over the dummy cell columns DL and DR.

For example, FIG. 6B illustrates a continuous PL interconnect 602 located over the dummy cell columns DL and DR at the farthest point of the array segment (plate group) 600 away from the common plate line driver 408 in accordance with the present invention. In this way, the common plate lines PL0-1 to PL62-63, are interconnected at both sides of the array segment 600. Thus, the resistance of any one plate line is dramatically reduced by paralleling it to all the other 32 plate lines of the plate group. Simulations demonstrate a reduction of the peak negative voltage spike from 132 mV for a prior art common plate line configuration down to about 61 mV for the array configuration of FIG. 6B. As indicated above, an advantage of using the dummy cell columns for the PL interconnections, is that interconnects in this location will have minimal impact on the active bit line capacitance. Alternately, the interconnection between plate lines can be done outside the array on the side opposite to the common plate line driver (not shown) with similar improvement in the resistance reduction. However, such an implementation could increase the chip area.

FIG. 6C illustrates example adjacent cell PL interconnections 604 located over dummy cell columns and the active portions of array segment 600, and distributed across the array segment 600 in accordance with the present invention. As stated above, in the active portion of the array 600, the PL interconnections 604, if used in this area, are staggered or offset with respect to each other, are used sparingly, and are kept short to avoid increasing the bit line capacitance. The plate lines of two adjacent FeRAM cells of a column are interconnected, and the plate lines of two more adjacent cells of another column are interconnected, wherein the first interconnect is offset relative to the second interconnect. For example, consider the PL interconnect 604 of column 0 and column 1. Plate lines PL60-61 and PL58-59 of two adjacent cells of column 0 are shorted with a first interconnect 604, and plate lines PL58-59 and PL56-57 of two adjacent cells of column 1 are shorted with a second interconnect 604 offset from the first interconnect 604.

Similarly, FIG. 6D illustrates an example combination of continuous PL interconnections 602 over dummy cell column DR, and adjacent cell PL interconnections 604 over dummy cell column DL and all the active cell columns 0-63 of array segment 600.

It will be appreciated in the context of the present invention that any combination of continuous PL interconnections 602 over dummy cell columns and/or over active cell columns, and/or adjacent cell PL interconnections 604 over active cell and/or dummy cell columns may be utilized in the present invention, including continuous PL interconnections 602 over both dummy cell columns DR and DL. Further, other array orientations of rows and columns and corresponding plate line interconnection is contemplated in the context of the present invention.

In addition, the common plate line connection PL 406 may be made to the plurality of plate lines PL0-1 to PL62-63 either internal to the core region of the array segment or external to the core region in accordance with the invention. Further, the common plate line connection PL 406 may be made to the plurality of plate lines PL0-1 to PL62-63 on the same metal layer as the plate line (e.g., MET1) or on a different metal layer (e.g., MET2).

FIGS. 7A-7D illustrate example layouts of the 1T1C FeRAM memory cell 100 of FIG. 1A and 402 of FIG. 4, and the array of FIG. 4, used in accordance with the present invention to reduce the plate line resistance. The example layouts further illustrate various example combinations of plate line interconnection structures including interconnections within the dummy columns and/or the active cell columns of arrays similar to those of FIGS. 6A-6D.

Figure 7A:
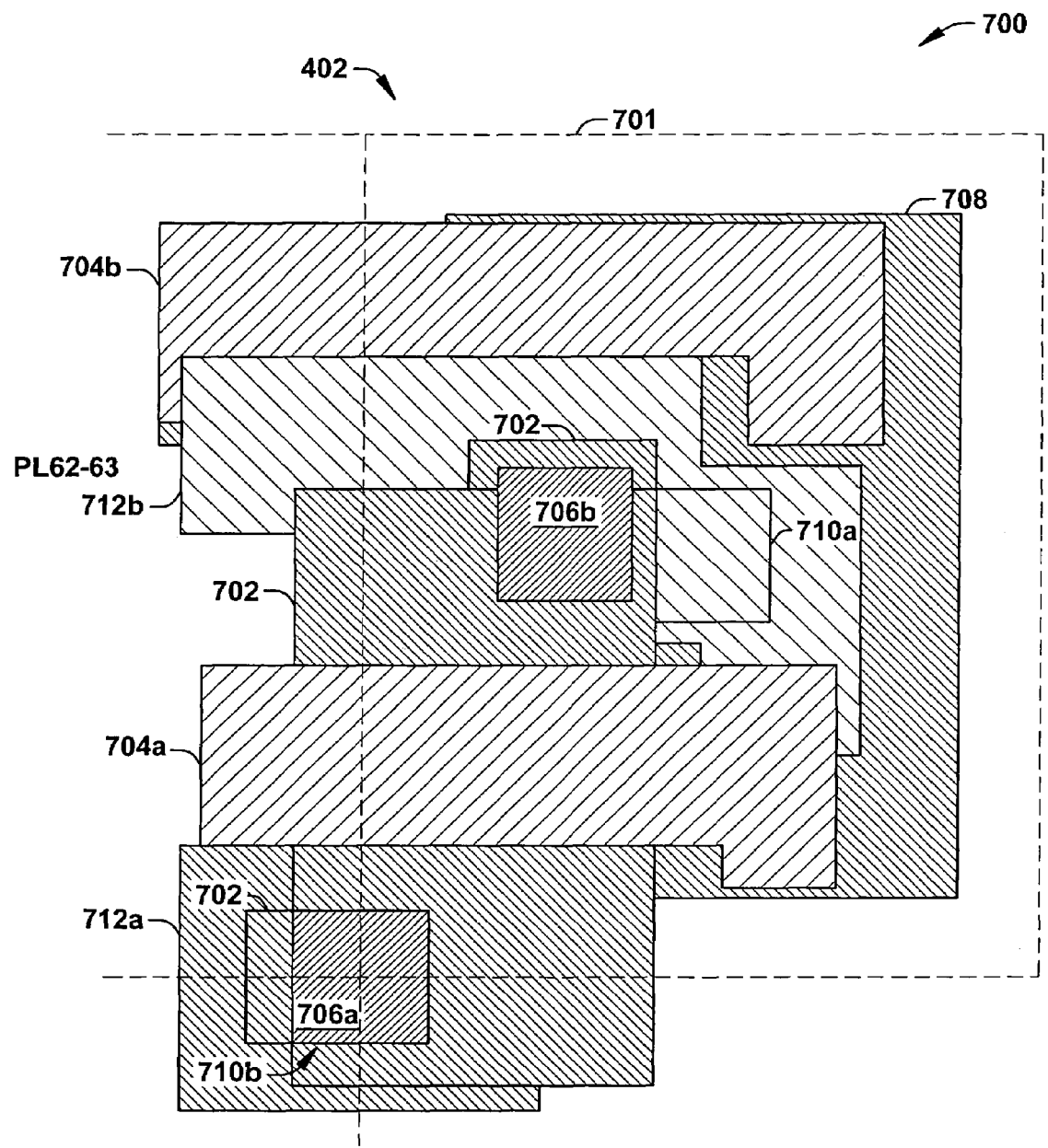
FIGS. 7A-7F are plan views of example layouts of the 1T1C FeRAM memory cell of FIG. 1A and array of FIG. 4, illustrating various example combinations of plate line interconnection structures including interconnections within the dummy columns and/or the active cell columns of arrays similar to those of FIGS. 4 and 6A-6D, used in accordance with the present invention to reduce the plate line resistance.
Figure 7B:
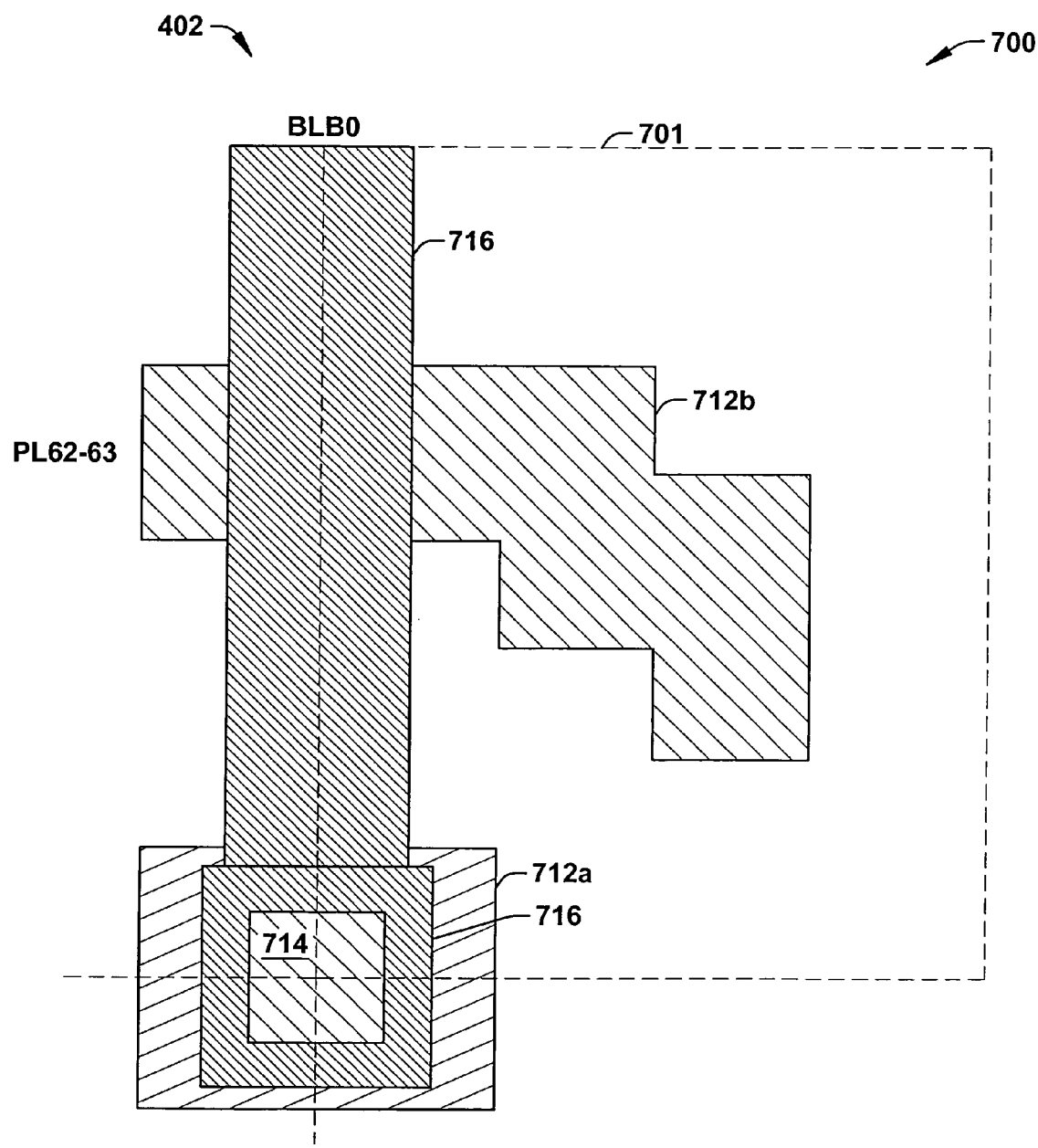

FIGS. 7A and 7B, for example, illustrate an example memory cell layout 700 of a cell similar to the 1T1C FeRAM memory cell 402 of FIG. 4. Cell layout 700 will then also be shown in the context of a larger memory array layout 718 of FIG. 7C, similar to the array 400 of FIG. 4 and 600 of FIGS. 6A-6D.

The cell layout 700 of the individual cells 402 is defined by cell boundaries 701 within the larger array 718. Cell 402, comprises an underlying active region layer 702. A pass-gate polysilicon layer 704a forms the gate region of the current pass-gate transistor 412 of the FeRAM cell 402, while pass-gate polysilicon layer 704b is also shown in the layout to indicate the gate region of the next pass-gate transistor 412 of the adjacent FeRAM cell 402. Cell 402 also comprises conductive contacts (e.g., tungsten) provide a bit line contact 706a and a FeCap and active region contact 706b. Cell 402 of layout 700 also comprises an FeCap material layer 708. Cell 402 further comprises a Via0 710a that conductively joins the FeCap 708 top electrode to a plate line 712b in an M1 first metal layer, and a Via0 710b that joins contact 706a to a bit line contact (pad) 712a in the M1 metal layer.

FIG. 7B further illustrates the cell 402 layout 700, comprising a Via1 layer 714 used for a bit line contact, and a second M2 metal layer that forms the bit line or a bit line-bar BUBLB 716 and a bit line contact pad 716.

Figure 7C:
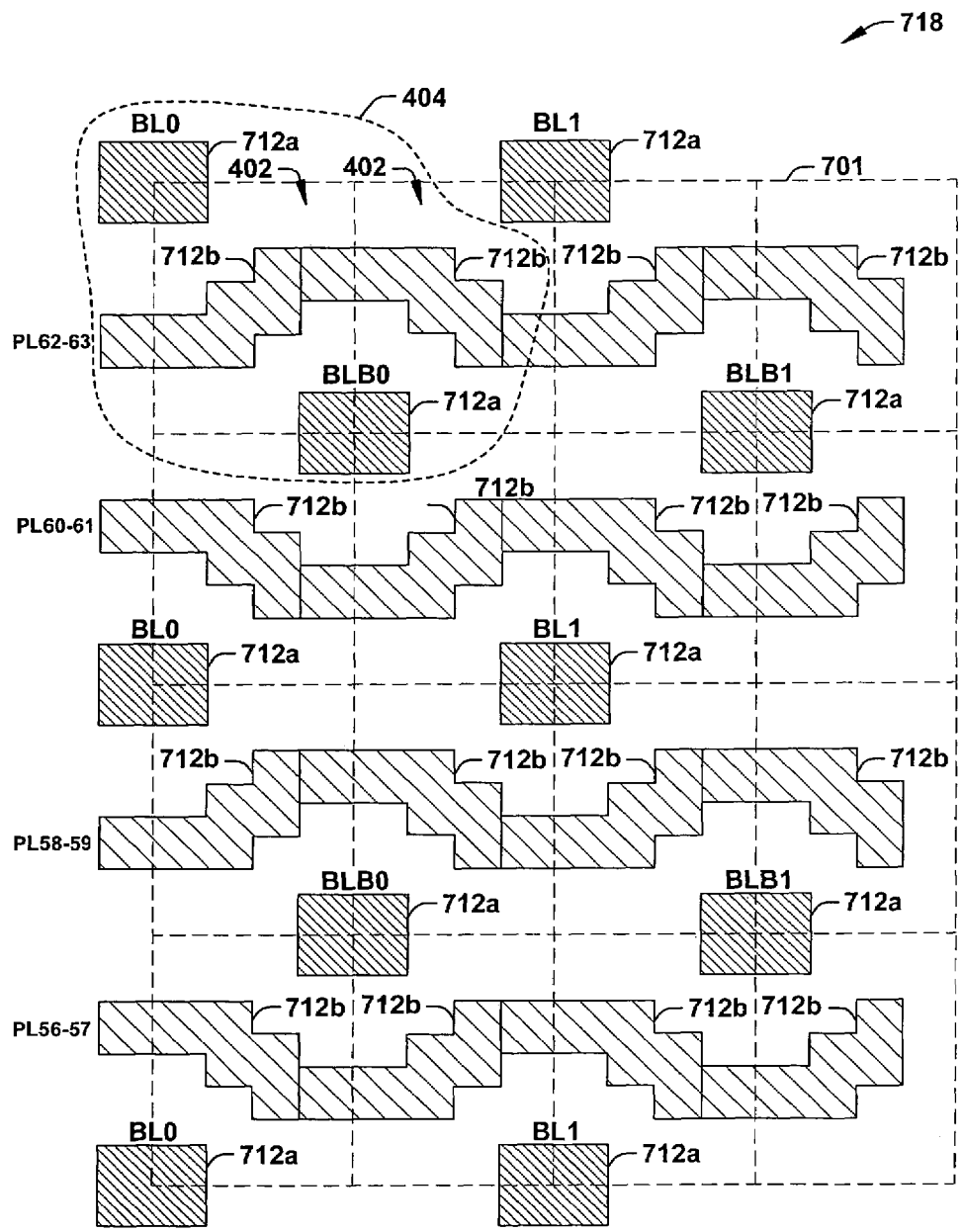

FIG. 7C further illustrates the cell layout 700 in the context of the overall memory array layout 718 similar to the array 400 of FIG. 4 and 600 of FIGS. 6A-6D. For example, cell pair 404 comprises cell_62_0 (402) and cell_63_0 (402) having plate line PL62-63 shared in common, as illustrated by the two M1 segments 712b that adjoin one another to form a single continuous plate line PL62-63. The example cell pair 404, as illustrated, is in column 0 of the array segment as shown by the bit line contact pads BL0 and BLB0 (712a). All the features shown are formed within the M1 metal layer. FIGS. 7A-7C show the 1T1C FeRAM memory cell 700 and array 718 without any plate line interconnection structures. FIG. 7C generally correlates with FIG. 6A.

Figure 7D:
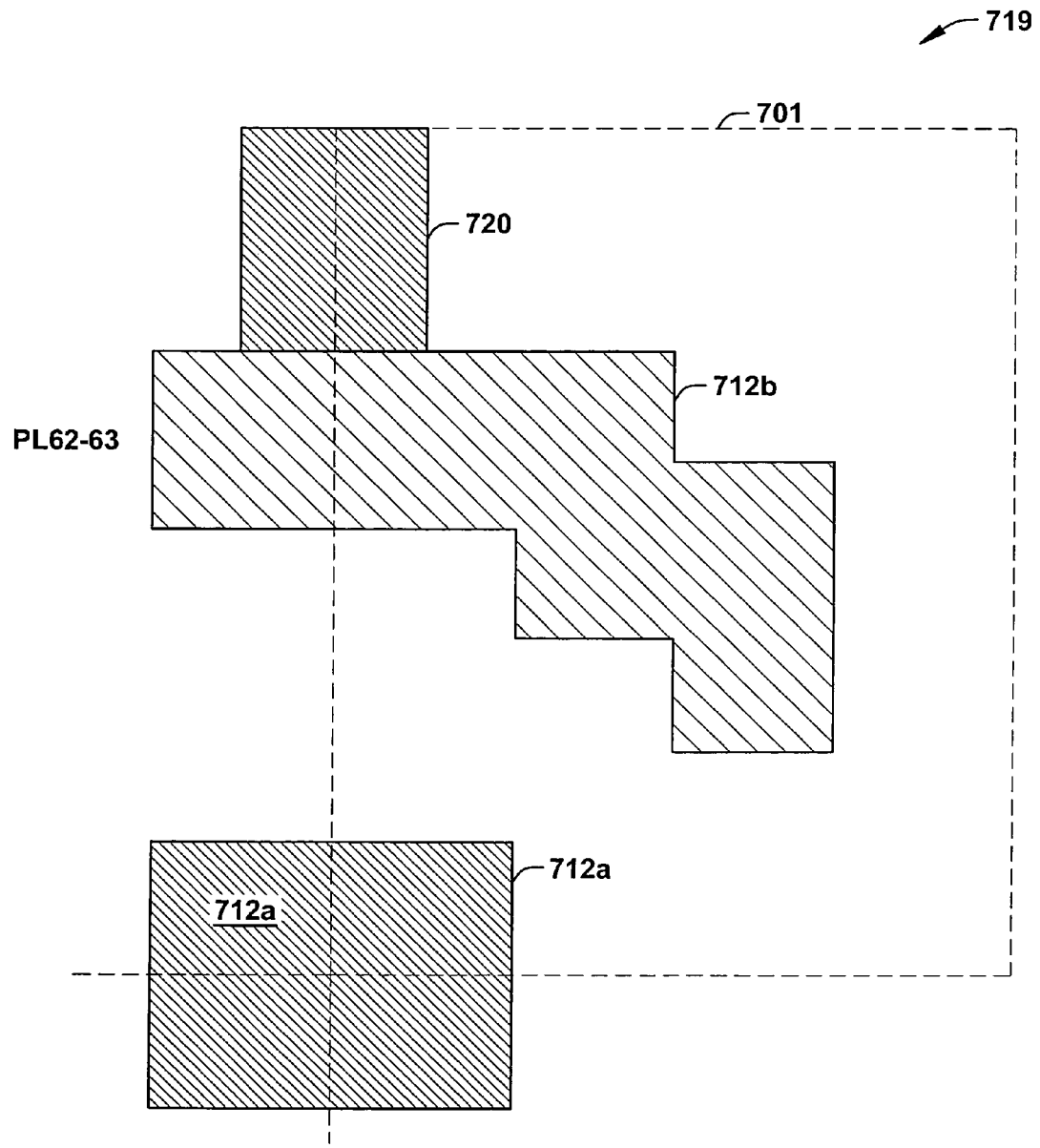

FIG. 7D illustrates an example cell layout 719 similar to that of cell layout 700, but with the addition of a plate line interconnect structure 720 formed in the M1 layer, for example, along with the M1 plate line element 712b. As can be seen by comparing FIG. 7D to the bit line structure 716 of FIG. 7B, the additional plate line interconnect structure 720 is shown aligned under the bit line structure 716. Because this may increase the bit line capacitance of the active cells of the array, these PL interconnects 720 are preferably used in the dummy cell columns, and are used sparingly in the active cell columns. Alternately, such PL interconnect structures 720 may be offset relative to the bit line elements 716, or the PL interconnections may be accomplished on another metal layer.

Figure 7E:
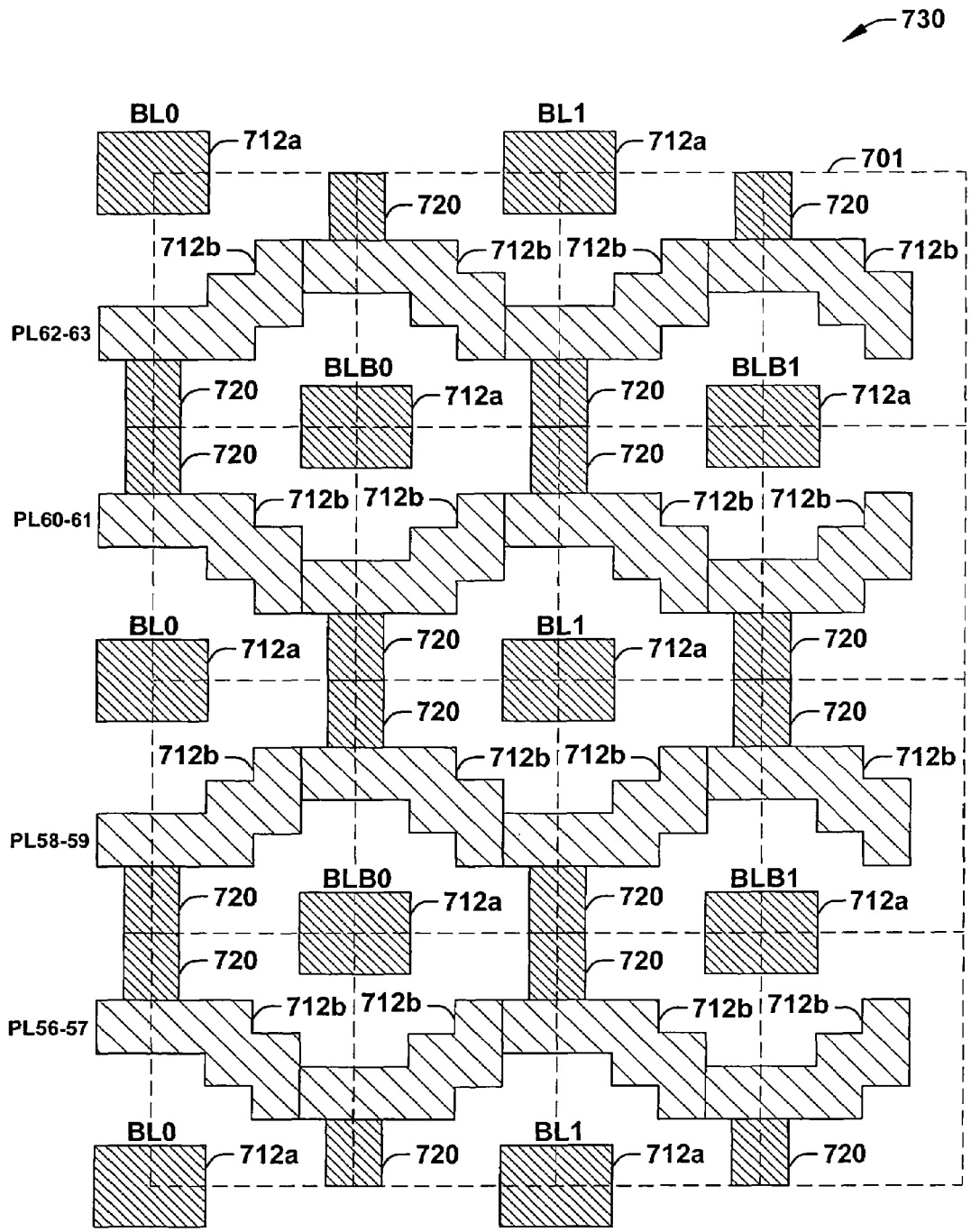

FIG. 7E illustrates an example array layout 730 of cells using the cell layout 719 of FIG. 7D and having a PL interconnect structure 720 present on every cell of the array segment. Effectively, this forms a conductive grid of interconnects 720 joining all plate lines together within all the columns of the array segment. Thus, the plate lines provide row conductivity; while the PL interconnects 720 provide column conductivity between all plate lines at every column in a plate group.

Figure 7F:
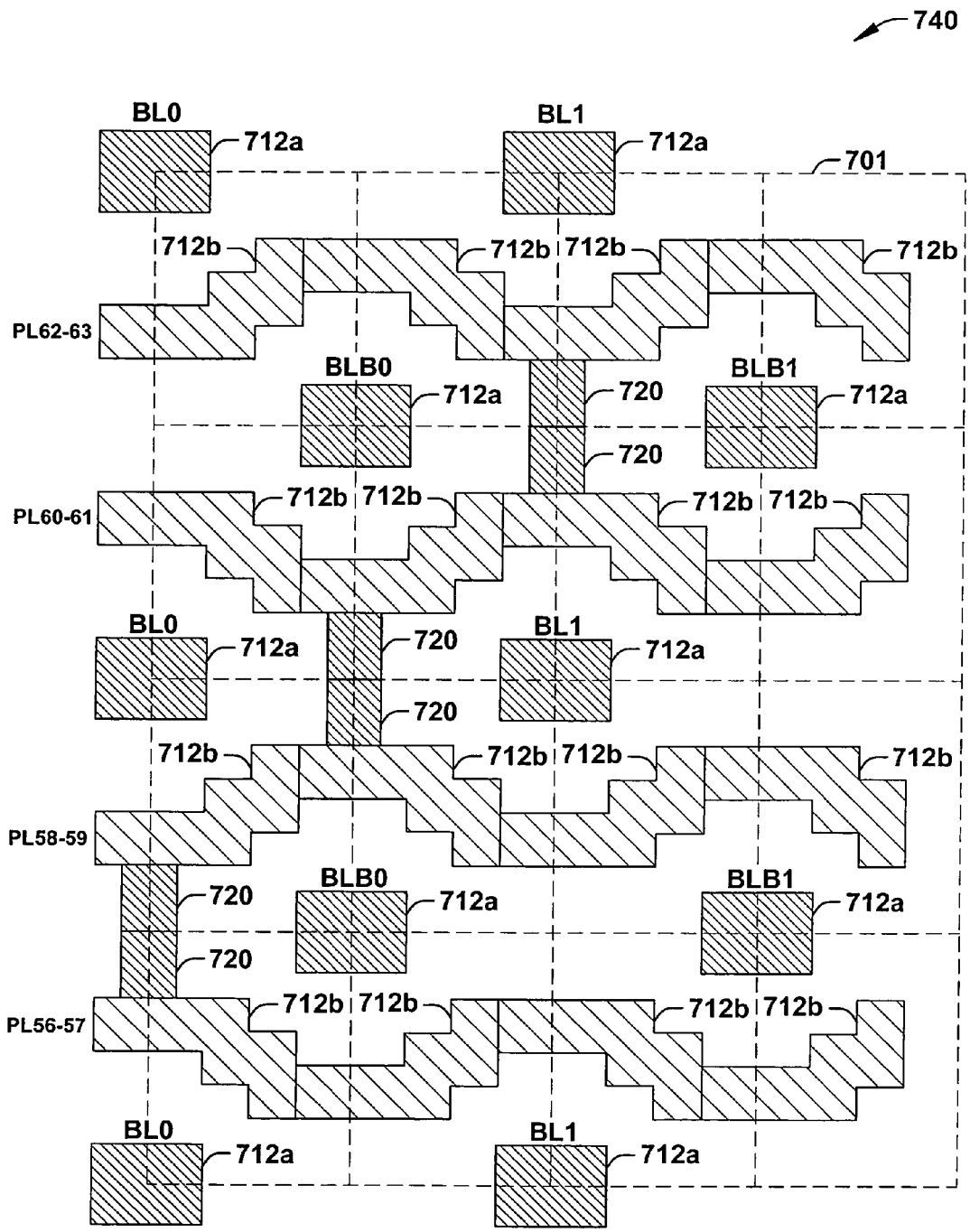

FIG. 7F illustrates an example array layout 740, generally correlating with the concept of FIG. 6C, wherein the cell layout 719 of FIG. 7D is again utilized, having PL interconnects 720 present between adjacent cells in a bit line direction, and staggered or offset from one another in a bit line as well as a word line direction to minimize any increase in the bit line capacitance.

Where more that one dummy bit line is used at the edge of an array portion, the plate lines of two or more dummy cell columns may be continuously interconnected in both a bit line direction or word line direction, or otherwise shorted together without departing from the spirit and scope of the present invention. In addition, the invention is not limited to the specific memory technologies discussed herein, and may be implemented in association with other memory architectures wherein storage capacitors, pass transistors, plate lines, bit lines and wordlines are used in the memory cells in the fabrication of semiconductor products.

The invention is also not limited to the use of dummy columns, M1 metal layers, and FeRAM, and may be implemented in association with the manufacture of various semiconductor devices, dummy rows, or other dummy element groupings of an array, wherein the various aspects thereof may be applied. The invention may also be used on any other non-active column(s) that need not be at the outer periphery region of the active (core) array used to store the data. Non-active (dummy) column(s) could be surrounded by active column(s) on one or both sides.

A cell may comprise a 1T1C cell or it may comprise a pair of 1T1C cells. The 1T1C cells in a pair of cells may belong to one 2T2C cell or they may belong to two different 2T2C cells of a 2T2C FeRAM. These and other combinations including more that two 1T1C cells and variations are contemplated within the context of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." Also, the term "example", when utilized herein, simply denotes an illustrative example or instance, and not necessarily a preferred embodiment, unless otherwise indicated.

What is claimed is:

1. An array of FeRAM memory cells, comprising:
a plurality of columns arranged along a bit line direction and a plurality of rows arranged along a word line direction;
a plurality of plate lines arranged along a word line direction;
a common plate line driver connected to, and configured to drive the plurality of plate lines, thereby globally interconnecting the plate lines in the array;
first and second FeRAM memory cells arranged in the bit line direction in a first column, the first and second FeRAM memory cells operably associated with different plate lines; and
third and fourth FeRAM memory cells arranged in the bit line direction in a second column, the third and fourth FeRAM memory cells operably associated with different plate lines,
wherein a plate line of the first FeRAM memory cell is locally interconnected to a plate line of the second FeRAM memory cell by a first local plate line interconnection, and a plate line of the third FeRAM memory cell is locally interconnected to a plate line of the fourth FeRAM memory cell by a second local plate line interconnection, thereby providing an FeRAM memory array having a reduced plate line resistance.

2. The array of claim 1, further comprising
fifth and sixth FeRAM memory cells arranged in the bit line direction in the first column; the fifth and sixth FeRAM memory cells operably associated with different plate lines;
and seventh and eighth FeRAM memory cells arranged in the bit line direction in the second column, the seventh and eighth FeRAM memory cells operably associated with different plate lines; and
wherein a plate line of the fifth FeRAM memory cell is not locally interconnected to a plate line of the sixth FeRAM memory cell, and a plate line of the seventh FeRAM memory cell is not locally interconnected to a plate line of the eighth FeRAM memory cell.

3. The array of claim 1, wherein a cell in the array of FeRAM memory cells comprises a 1T1C cell.

4. The array of claim 1, wherein a cell in the array of FeRAM memory cells comprises a 2T2C cell.

5. The array of claim 1, wherein a cell in the array of FeRAM memory cells comprises a pair of 1T1C cells.

6. The array of claim 5, wherein the 1T1C cells in the pair belong to different 2T2C cells.

7. The array of claim 1, wherein a cell in the array of FeRAM memory cells comprises a pass gate transistor and one capacitor.

8. The array of claim 1, wherein a cell in the array of FeRAM memory cells comprises two pass gate transistors and two capacitors.

9. The array of claim 1, wherein a cell in the array of FeRAM memory cells comprises a first pass gate transistor and a first capacitor and a second pass gate transistor a second capacitor.

10. The array of claim 9, wherein the first pass gate transistor and the first capacitor belong to a first 1T1C cell and the second pass gate transistor and the second capacitor belong to a second 1T1C cell.

11. The array of claim 1, further comprising a column of dummy cells, wherein two or more plate lines of the plurality of plate lines associated with the dummy cells are locally interconnected to each other by a third local plate line interconnection.

12. The array of claim 11, wherein the column of dummy cells is located on the opposite side of the array from the common plate line driver interconnection to the plurality of plate lines.

13. The array of claim 1, further comprising a column of dummy cells, wherein the plurality of plate lines associated with the dummy cells are locally interconnected to each other by a third local plate line interconnection.

14. The array of claim 1, wherein no more than two adjacent memory cells of a column of memory cells are locally interconnected to each other by a third local plate line interconnection.

15. The array of claim 1, wherein two or more adjacent columns of FeRAM memory cells each comprising two adjacent memory cells operably associated with different plate lines locally interconnected to each other, and wherein the local interconnections within the columns are offset from one another along the bit line direction.

16. The array of claim 15, further comprising a column of dummy cells, wherein two or more plate lines of the plurality of plate lines associated with the dummy cells are locally interconnected to each other by a third local plate line interconnection.

17. The array of claim 1, wherein each column of FeRAM memory cells of the array comprises a common plate line interconnection between all the FeRAM memory cells of the column, thereby forming a conductive grid comprising a plurality of local plate line interconnections.

18. The array of claim 1, wherein the common plate line driver connections to the plurality of plate lines are made on a metal layer other than the layer used for the plate lines.

19. The array of claim 1, wherein one or more of the local plate line interconnections are made on a metal layer other than the layer used for the plate lines.

20. The array of claim 1, wherein one or more of the local plate line interconnections are made outside the memory array on the opposite side from the common plate line driver.

21. The array of claim 1, wherein one or more of the local plate line interconnections are made on the same metal layer as the plate line.

22. A memory array, comprising:
a plurality of FeRAM memory cells arranged in rows of memory cells along a word line direction and columns of memory cells along a bit line direction;
a plurality of plate lines associated with the rows of memory cells;
a common plate line driver connected to, and configured to drive the plurality of plate lines, thereby globally interconnecting the plate lines in the array;
first and second FeRAM memory cells arranged adjacent to each other in the bit line direction in a first column, the first and second FeRAM memory cells operably associated with different plate lines; and
third and fourth FeRAM memory cells arranged adjacent to each other in the bit line direction in a second column, the third and fourth FeRAM memory cells operably associated with different plate lines;
wherein a plate line of the first FeRAM memory cell is locally interconnected to a plate line of the second FeRAM memory cell by a first local plate line interconnection, and a plate line of the third FeRAM memory cell is locally interconnected to a plate line of the fourth FeRAM memory cell by a second local plate line interconnection, thereby providing an FeRAM memory array having a reduced plate line resistance.

23. The array of claim 22, further comprising fifth and sixth FeRAM memory cells arranged adjacent to each other in the bit line direction in the first column;
and seventh and eighth FeRAM memory cells arranged adjacent to each other in the bit line direction in the second column; and
wherein a plate line of the fifth FeRAM memory cell is not locally interconnected to a plate line of the sixth FeRAM memory cell, and a plate line of the seventh FeRAM memory cell is not locally interconnected to a plate line of the eighth FeRAM memory cell.

24. The array of claim 22, wherein a cell in the array of FeRAM memory cells comprises a 1T1C cell.

25. The array of claim 22, wherein a cell in the array of FeRAM memory cells comprises a 2T2C cell.

26. The array of claim 22, wherein a cell in the array of FeRAM memory cells comprises a pair of 1T1C cells.

27. The array of claim 26, wherein the 1T1C cells in the pair belong to different 2T2C cells.

28. The array of claim 22, wherein a cell in the array of FeRAM memory cells comprises a pass gate transistor and one capacitor.

29. The array of claim 22, wherein a cell in the array of FeRAM memory cells comprises two pass gate transistors and two capacitors.

30. The array of claim 22, wherein a cell in the array of FeRAM memory cells comprises a first pass gate transistor and a first capacitor, and a second pass gate transistor a second capacitor.

31. The array of claim 30, wherein the first pass gate transistor and the first capacitor belong to a first 1T1C cell, and the second pass gate transistor and the second capacitor belong to a second 1T1C cell.

32. The array of claim 22, further comprising a column of dummy cells, wherein two or more plate lines of the plurality of plate lines associated with the dummy cells are locally interconnected to each other by a third local plate line interconnection.

33. The array of claim 22, further comprising a column of dummy cells, wherein the plurality of plate lines associated with the dummy cells are locally interconnected to each other by a third local plate line interconnection.

34. The array of claim 22, wherein two or more of the plurality of columns of memory cells comprise two adjacent memory cells operably associated with different plate lines locally interconnected to each other by a local plate line interconnection.

35. The array of claim 34, further comprising a column of dummy cells, wherein two or more plate lines of the plurality of plate lines associated with the dummy cells are locally interconnected to each other by a third local plate line interconnection.

36. The array of claim 35, wherein the column of dummy cells is located on the opposite side of the array from the common plate line driver interconnection to the plurality of plate lines.

37. The array of claim 22, wherein no more than two adjacent memory cells of a column of memory cells have plate lines locally interconnected to each other by a third local plate line interconnection.

38. The array of claim 22, wherein two, or more adjacent columns of FeRAM memory cells each comprising two adjacent FeRAM memory cells operably associated with different plate lines locally interconnected to each other, and wherein the local interconnections within the columns are offset from one another along the bit line direction.

39. The array of claim 38, further comprising a column of dummy cells, wherein two or more plate lines of the plurality of plate lines associated with the dummy cells are locally interconnected to each other by a third local plate line interconnection.

40. The array of claim 22, wherein each column of FeRAM memory cells of the array comprises a common plate line interconnection between all the FeRAM memory cells of the column, thereby forming a conductive grid comprising a plurality of local plate line interconnections.

41. The array of claim 22, wherein the common plate line driver connections to the plurality of plate lines are made on a metal layer other than the layer used for the plate lines.

42. The array of claim 22, wherein one or more of the local plate line interconnections within each column of memory cells are made on a metal layer other than the layer used for the plate lines.

43. The array of claim 22, wherein one or more of the local plate line interconnections within each column of memory cells are made outside the memory array on the opposite side of the array from the common plate line driver.

44. The array of claim 1, wherein
the first and second FeRAM memory cells are arranged adjacent to each other in a bit line direction, and the plate lines of the first and second FeRAM memory cells are adjacent plate lines, and
the third and fourth FeRAM memory cells are arranged adjacent to each other in a bit line direction, and the plate lines of the third and fourth FeRAM memory cells are adjacent plate lines.

45. The array of claim 2, wherein
the fifth and sixth FeRAM memory cells are arranged adjacent to each other in a bit line direction, and the plate lines of the fifth and sixth FeRAM memory cells are adjacent plate lines, and
the seventh and eighth FeRAM memory cells are arranged adjacent to each other in a bit line direction, and the plate lines of the seventh and eighth FeRAM memory cells are adjacent plate lines.

* * * * *